United States Patent
Wood

(10) Patent No.: US 9,666,523 B2
(45) Date of Patent: May 30, 2017

(54) SEMICONDUCTOR WAFERS WITH THROUGH SUBSTRATE VIAS AND BACK METAL, AND METHODS OF FABRICATION THEREOF

(71) Applicant: FREESCALE SEMICONDUCTOR, INC., Austin, TX (US)

(72) Inventor: Thomas E. Wood, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/808,210

(22) Filed: Jul. 24, 2015

(65) Prior Publication Data

US 2017/0025349 A1    Jan. 26, 2017

(51) Int. Cl.
*H01L 21/786* (2006.01)
*H01L 23/544* (2006.01)
(Continued)

(52) U.S. Cl.
CPC ...... *H01L 23/5226* (2013.01); *H01L 21/6835* (2013.01); *H01L 21/76892* (2013.01);
(Continued)

(58) Field of Classification Search
CPC ............. H01L 23/5226; H01L 23/5227; H01L 23/526; H01L 23/544; H01L 23/646; H01L 23/642; H01L 23/5286; H01L 23/50; H01L 23/482; H01L 23/498; H01L 23/481; H01L 23/48; H01L 27/0705; H01L 27/0203; H01L 27/0688; H01L 27/07; H01L 21/6898; H01L 21/7692; H01L 21/76897; H01L 21/76898; H01L 21/768
See application file for complete search history.

(56) References Cited

U.S. PATENT DOCUMENTS 3,458,368 A * 7/1969 Haberecht ................. C23C 8/00
                                                       117/97
6,841,469 B2   1/2005 Sawada et al.
(Continued)

FOREIGN PATENT DOCUMENTS

EP    2 509 106 A1    10/2012

OTHER PUBLICATIONS

Extended European Search Report for Patent Appln. No. 116181064.3 (Nov. 10, 2016) 9 pgs.

*Primary Examiner* — Galina Yushina
(74) *Attorney, Agent, or Firm* — Sherry W. Schumm

(57) ABSTRACT

An embodiment of a semiconductor wafer includes a semiconductor substrate, a plurality of through substrate vias (TSVs), and a conductive layer. The TSVs extend between first and second substrate surfaces. The TSVs include a first subset of trench via(s) each having a primary axis aligned in a first direction, and a second subset of trench via(s) each having a primary axis aligned in a second and different direction. The TSVs form an alignment pattern in an alignment area of the substrate. The conductive layer is directly connected to the second substrate surface and to first ends of the TSVs. Using the TSVs for alignment, the conductive layer may be patterned so that a portion of the conductive layer is directly coupled to the TSVs, and so that the conductive layer includes at least one conductive material void (e.g., in alignment with a passive component at the first substrate surface).

17 Claims, 9 Drawing Sheets

(51) Int. Cl.
*H01L 23/522* (2006.01)
*H01L 21/768* (2006.01)
*H01L 23/48* (2006.01)
*H01L 23/528* (2006.01)
*H01L 27/07* (2006.01)
*H01L 21/683* (2006.01)

(52) U.S. Cl.
CPC .. *H01L 21/76897* (2013.01); *H01L 21/76898* (2013.01); *H01L 23/481* (2013.01); *H01L 23/528* (2013.01); *H01L 23/5227* (2013.01); *H01L 23/544* (2013.01); *H01L 27/0705* (2013.01); *H01L 2221/6834* (2013.01); *H01L 2221/68318* (2013.01); *H01L 2221/68327* (2013.01); *H01L 2221/68381* (2013.01); *H01L 2223/5442* (2013.01); *H01L 2223/54426* (2013.01); *H01L 2223/54453* (2013.01)

(56) References Cited

U.S. PATENT DOCUMENTS

| | | |
|---|---|---|
| 7,122,912 B2 | 10/2006 | Matsui |
| 2007/0166956 A1 | 7/2007 | Blanchard |
| 2009/0321915 A1* | 12/2009 | Hu ................ H01L 23/5389 257/690 |
| 2010/0210088 A1* | 8/2010 | Ishimaru ............. G03F 9/708 438/401 |
| 2010/0224876 A1 | 9/2010 | Zhu |
| 2010/0330798 A1 | 12/2010 | Huang et al. |
| 2011/0001249 A1* | 1/2011 | Law .................. H01L 23/481 257/776 |
| 2011/0068433 A1* | 3/2011 | Kim .................. H01L 23/552 257/531 |
| 2011/0068466 A1 | 3/2011 | Chen et al. |
| 2012/0056315 A1* | 3/2012 | Chang ............. H01L 21/6835 257/737 |
| 2012/0170887 A1* | 7/2012 | Yang ................. G02B 6/132 385/14 |
| 2012/0175789 A1 | 7/2012 | Farooq et al. |
| 2012/0256310 A1 | 10/2012 | Ide |
| 2014/0077369 A1* | 3/2014 | Liang ............ H01L 23/49827 257/738 |
| 2015/0021773 A1 | 1/2015 | Lee |
| 2015/0348904 A1* | 12/2015 | Huang ........... H01L 21/76802 257/774 |

\* cited by examiner

US 9,666,523 B2

SEMICONDUCTOR WAFERS WITH THROUGH SUBSTRATE VIAS AND BACK METAL, AND METHODS OF FABRICATION THEREOF

TECHNICAL FIELD

Embodiments of the subject matter described herein relate generally to semiconductor manufacturing, and more particularly to semiconductor wafers with through substrate vias and back metal.

BACKGROUND

A semiconductor wafer will be subjected to a number of manufacturing stages during fabrication of semiconductor devices included in the wafer. For example, numerous masking, patterning, etching, and film deposition processes may be performed over the frontside of the wafer in order to manufacture the multiple layers and features of a semiconductor device.

Alignment patterns are commonly used in semiconductor wafer processing to ensure accurate alignment of the various features of the multiple layers. Typically, the alignment patterns are configured so that they will be visible to alignment equipment at least from one side (e.g., the frontside) of the wafer. In addition, when a wafer is transparent to the illumination wavelength used by the particular alignment equipment that is used in the manufacturing process, the front side alignment patterns also may be visible through the wafer from the opposite side (e.g., the backside) of the wafer, thus allowing alignment of the opposite side. However, when a wafer is not transparent to the alignment equipment, or when the wafer backside is covered with an opaque material, alignment using frontside alignment patterns may not be possible. Accordingly, in such situations, frontside alignment patterns may not be useful in performing backside processing that requires alignment.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

An embodiment of the inventive subject matter includes a semiconductor wafer with one or more through substrate via (TSV) alignment marks and backside metal, and methods of making such a semiconductor wafer. Essentially, each alignment mark includes a plurality of trench-type TSVs, where a first subset of the TSVs have primary axes aligned in a first direction, and a second subset of the TSVs have primary axes aligned in a second direction that is different from the first direction (e.g., 90 degrees offset). A relatively thin backside conductive layer (or seed layer) is deposited over the wafer backside and the exposed ends of the TSVs. Despite the presence of the seed layer, and even when the backside conductive layer has grind marks that partially obscure visibility of the alignment mark (e.g., grind marks that are at a low angle or substantially parallel to the primary axes of one of the TSV subsets), the alignment mark may be optically detectable at the wafer backside due to the differing directions of the primary axes of the first and second TSV subsets. Accordingly, the alignment mark may be used for alignment for additional backside processing, such as for deposition of a thick, patterned metal layer over the seed layer.

For example, the additional backside processing may include patterning the seed layer to create one or more conductive material areas and conductive material openings or "voids" on the backside of the wafer, and depositing thick metal over the remaining conductive material areas of the seed layer. According to a further embodiment, the conductive material voids intentionally may be aligned with circuit elements at the wafer frontside. For example, the circuit elements may include passive elements (e.g., inductors and/or capacitors), and the underlying conductive material voids may allow for an improvement in the quality factor (Q) for the circuit elements.

Figure 1:
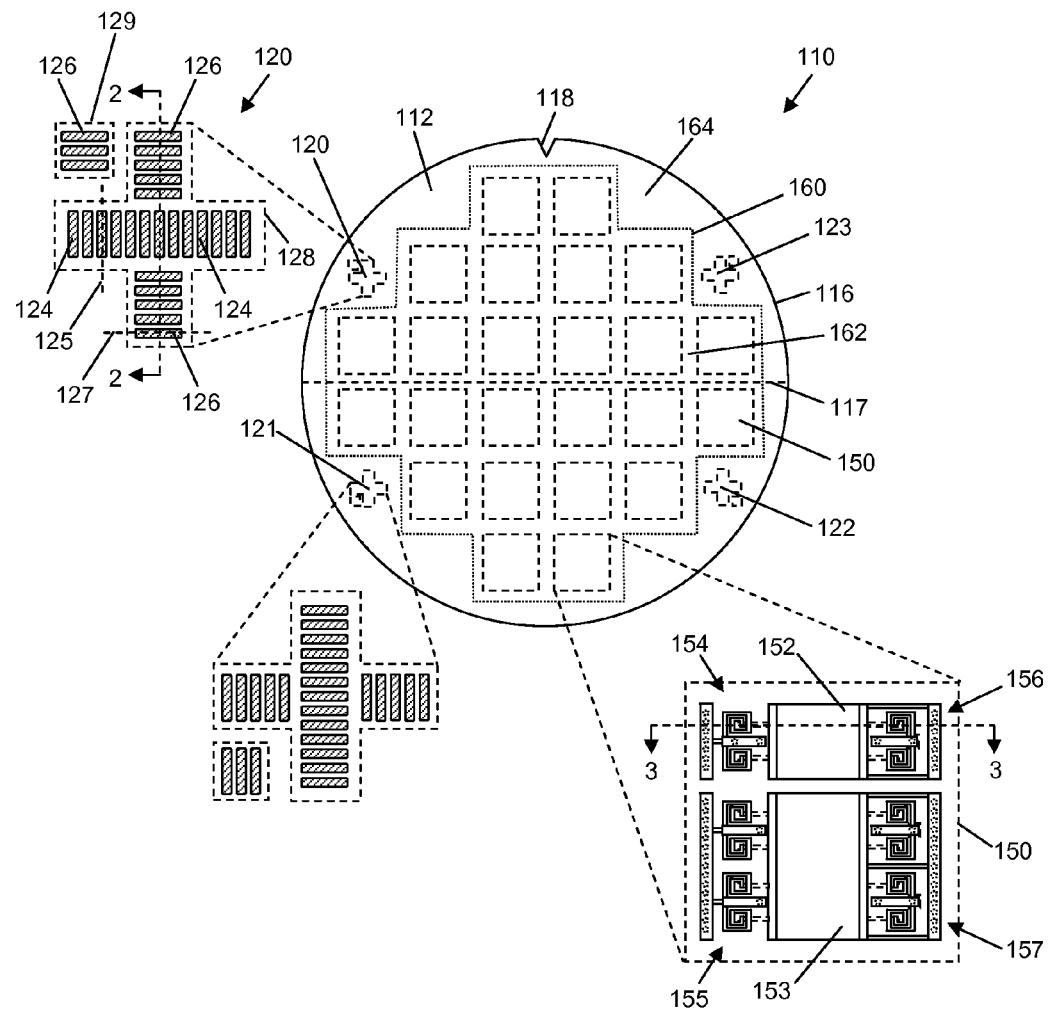
FIG. 1 is a top or frontside view of a semiconductor wafer depicting a plurality of alignment patterns and a plurality of semiconductor devices, according to an example embodiment.

FIG. 1 is a top or frontside view of a semiconductor wafer 110 depicting a plurality of alignment patterns 120-123 and a plurality of semiconductor devices 150, according to an example embodiment. Semiconductor wafer 110 may be, for example, a silicon wafer, a silicon-on-insulator (SOI) wafer, a silicon-on-sapphire (SOS) wafer, a gallium nitride (GaN) wafer, a GaN on silicon carbide wafer, a GaN on silicon wafer, a gallium arsenide (GaAs) wafer, or virtually any other type of semiconductor wafer comprising one or more semiconductor materials. Semiconductor wafer 110 may include a plurality of semiconductor devices 150 formed at and below a first surface 112 of the semiconductor wafer 110. The first surface 112 of the semiconductor wafer 110 is referred to subsequently herein as the wafer "frontside" 112. An opposed second surface 114 (FIGS. 2, 3) is parallel to the frontside 112 and separated by the thickness 113 of the semiconductor wafer 110. The second surface 114 is referred to subsequently herein as the wafer "backside" 114.

Figure 2:
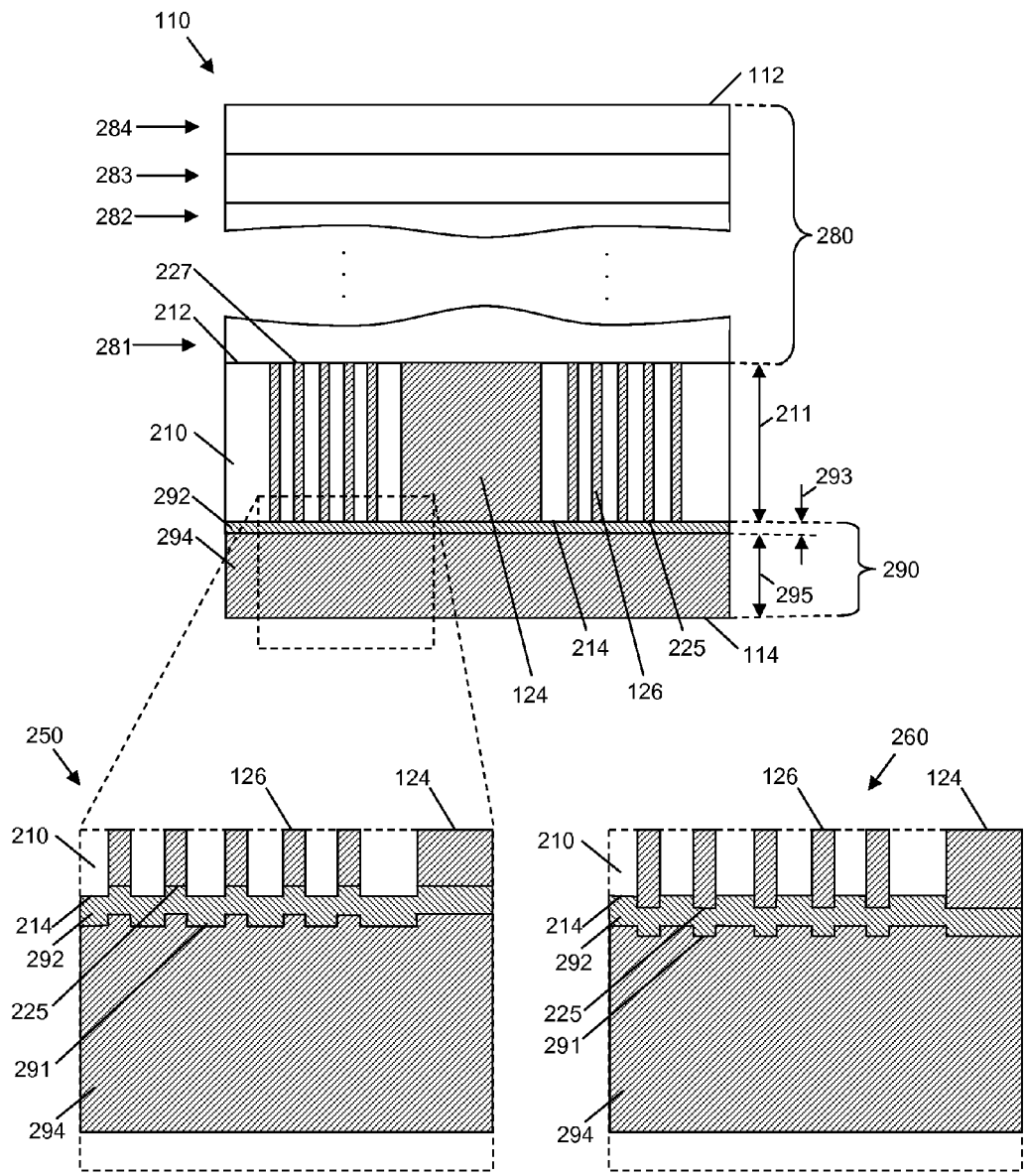
FIG. 2 is a cross-sectional, side view of an alignment pattern along line 2-2 of FIG. 1, according to an example embodiment.
Figure 3:
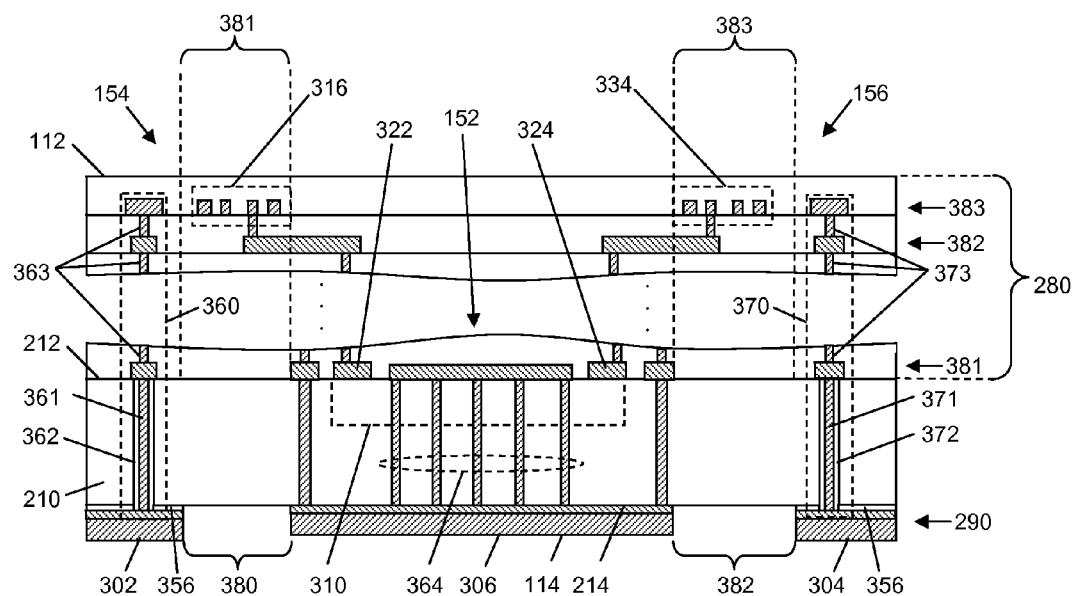
FIG. 3 is a cross-sectional, side view of a semiconductor device along line 3-3 of FIG. 1, according to an example embodiment.

Referring also to FIGS. 2 and 3, which are cross-sectional, side views of semiconductor wafer 110 along lines 2-2 and 3-3 of FIG. 1, respectively, the wafer 110 includes a semiconductor substrate 210 with first and second opposed surfaces 212, 214, and a plurality of conductive and insulating layers 280, 290 (referred to herein as "build up layers") formed on and over the surfaces 212, 214 of the semiconductor substrate 210. In the various cross sectional figures, only the lowest (i.e., closest to substrate 210) and highest (i.e., closest to the wafer surface 112) build up layers 280, 290 are depicted for simplicity, and vertical ellipses " . . . " are included to indicate that additional dielectric and conductive layers may be included between the lowest and highest build up layers 280, 290. The exposed surface of the outermost build up layer 284 overlying the first surface 212 of the substrate 210 corresponds to the wafer frontside 112, and the exposed surface of the outermost layer 294 overlying the second surface 214 of the substrate 210 corresponds to the wafer backside 114. Although FIGS. 2 and 3 show only conductive build up layers 290 on surface 214 of the substrate 210, in an alternate embodiment, the build up layers 290 on surface 214 may include both conductive and insulating layers (e.g., allowing for one or more of the layers to function as a redistribution layer (RDL) or to provide for interconnects between various components of a device).

For example, the substrate 210 may have a thickness 211 in a range of about 50 microns to about 100 microns (e.g., about 75 microns), although the substrate 210 may be thinner or thicker, as well. The substrate 210 may include, for example, a base semiconductor substrate and one or more additional semiconductor layers epitaxially formed on the surface of the base semiconductor substrate. In a particular example embodiment, the substrate 210 is a high-resistivity silicon substrate (e.g., a silicon substrate having bulk resistivity in a range of about 1000 ohm/centimeter (cm) to about 100,000 ohm/cm or greater). Alternatively, the substrate 210 may be a semi-insulating GaAs substrate (e.g., a GaAs substrate having bulk resistivity up to $10^8$ ohm/cm), or another suitable high-resistivity substrate. In such embodiments, and as will be described in more detail later, electrical connections between the top and bottom substrate surfaces 212, 214 may be made using conductive through substrate vias (TSVs) (e.g., TSVs 361, 364, 371, FIG. 3). Other embodiments may be implemented using low-resistivity substrates.

According to an embodiment, the semiconductor devices 150 primarily are formed at and below the first surface 212 of the substrate 210, and each semiconductor device 150 also may include conductive interconnects and components formed from the plurality of conductive and insulating layers 280 formed on and over the first surface 212. As shown in FIG. 1, the plurality of semiconductor devices 150 may be arranged in an array pattern within a substantially central device region 160 of the semiconductor wafer 110, where the device region 160 is indicated in FIG. 1 with an enclosed dotted-line shape. Sacrificial zones, including "saw streets" 162, may separate distinct devices 150. In addition, a sacrificial edge region 164 is present between the device region 160 and a perimeter 116 of the semiconductor wafer 110.

Each of the devices 150 may include combinations of one or more active devices (e.g., transistors), passive devices (e.g., resistors, capacitors, inductors), transducers (e.g., micro-electromechanical system (MEMS) devices), and associated conductive interconnects and isolation structures. According to an embodiment, and as will be described in more detail later in conjunction with FIG. 3, at least one of the devices 150 includes patterned backmetal (e.g., formed from conductive layers 290) on the bottom surface of the device 150 (e.g., on the backside 114 of the wafer 110).

According to a specific example embodiment, and as shown in more detail in the enlarged depiction of device 150 in FIG. 1, a device 150 may include one or more transistors 152, 153 (e.g., corresponding to main and peaking amplifiers of a Doherty amplifier, or to other transistor(s) of other types of amplifiers), one or more input impedance matching circuits 154, 155, one or more output impedance matching circuits 156, 157, and a plurality of terminals (e.g., terminals 302, 304, 306, FIG. 3) configured to receive and convey electrical signals, to receive power, to connect to a ground reference, and so on. An embodiment of device 150 will be described in more detail in conjunction with FIG. 3.

According to an embodiment, semiconductor wafer 110 also includes one or more alignment patterns 120, 121 122, 123, which are configured so that they are visible from the wafer backside 114 to conventional semiconductor manufacturing equipment at least prior to deposition of conductive layer 294 (FIG. 2), as will be described in more detail below. The alignment patterns 120-123 all may be located outside of the device region 160 (e.g., within the sacrificial edge region 164), in an embodiment. Alternatively, one or more of the alignment patterns 120-123 may be located within the device region 160. Although alignment patterns 120-123 are shown to be positioned in particular locations, the alignment patterns may be located elsewhere, with their locations being dependent upon the particular alignment equipment being used. For example, for some alignment equipment, it may be required that the alignment patterns are located within some distance of the wafer centerline 117 (e.g., 10-15 millimeters from the centerline 117 toward or away from the wafer notch 118).

As shown in more detail in the enlarged depiction of alignment pattern 120 in FIG. 1, and referring also to FIG. 2, which is a cross-sectional, side view of alignment pattern 120 along line 2-2 of FIG. 1, an alignment pattern 120 includes a plurality of through substrate vias (TSVs) 124, 126 arranged together within an alignment area of the wafer 110. Each TSV 124, 126 is filled with a conductive material (e.g., tungsten or some other material), in an embodiment, although TSVs 124, 126 may be filled with a non-conductive material, as well.

In the illustrated embodiment, the alignment area 120 includes a main area 128 and a pattern identifier area 129. In the embodiment of FIG. 1, the main area 128 of each of the alignment patterns 120-123 is substantially cross-shaped, and the pattern identifier area 129 for each of the alignment patterns 120-123 is nested within a different one of four quadrants defined by the cross. Nesting the pattern identifier area 129 in different quadrants for each alignment pattern 120-123 enables the alignment equipment to identify which particular alignment pattern it is aligning to. For example, the alignment equipment may align to alignment pattern 120 when a first layer is being formed, and may align to alignment pattern 121 when a second layer is being formed.

In FIG. 1, the pattern identifier area 129 for alignment pattern 120 is located in the upper left quadrant, whereas the quadrant locator area for alignment pattern 121 is located in the lower left quadrant, the quadrant locator area for alignment pattern 122 is located in the lower right quadrant, and the quadrant locator area for alignment pattern 123 is located in the upper right quadrant. This configuration enables the alignment equipment to align to four different alignment patterns 120-123 (e.g., during formation of four different layers). In other embodiments, an alignment pattern may include multiple pattern identifier areas, enabling more than four unique alignment marks to be included on the wafer.

The plurality of TSVs 124, 126 includes a first subset of elongated (or "trench") vias 124 each having a primary axis 125 aligned in a first direction, and a second subset of trench vias 126 each having a primary axis 127 aligned in a second direction that is different from the first direction. According to an embodiment, the first direction is orthogonal to (i.e., at 90 degrees to) the second direction. In other embodiments, the first direction may be offset from the second direction by an angle in a range of about 30 degrees to about 89 degrees.

Figure 14:
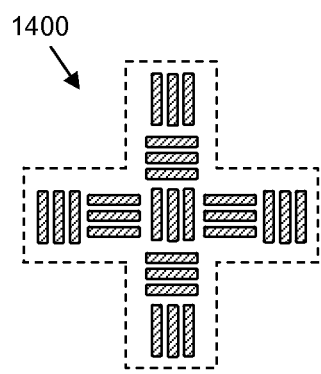
FIGS. 14-16 are top views of alternate alignment patterns, according to several additional example embodiments.
Figure 15:
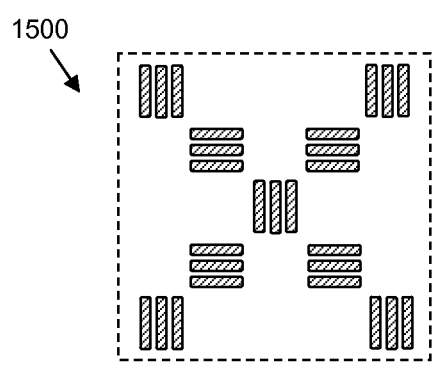
Figure 16:
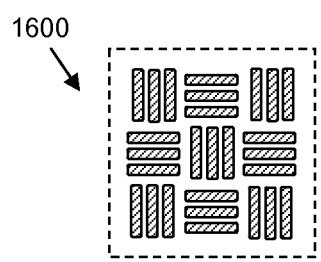

The first and second subsets of vias 124, 126 each may include as few as one via 124, 126, or the first and second subsets of vias 124, 126 each may include multiple vias 124, 126, as shown. In the illustrated example, the first subset of vias 124 includes thirteen vias 124 all arranged adjacent to one another in a linear pattern (i.e., having their centers aligned along a line that is orthogonal to their primary axes 125), and the second subset of vias 126 includes thirteen vias 126 that are clustered into three distinct clusters (i.e., the second subset of vias 126 include two clusters of five vias and one cluster of three vias that are not all adjacent to one another). Although a particular pattern and number of first and second vias 124, 126 is illustrated in FIG. 1, other embodiments of alignment patterns may include more or fewer vias 124, 126 in each subset, and/or may include vias that are arranged and/or clustered in different configurations. For example several differently-configured alignment patterns 1400, 1500, 1600 are shown in FIGS. 14-16. A plethora of different alignment patterns may be designed which include the novel features of the inventive subject matter, as would be understood to those of skill in the art, based on the description herein.

In dimensions that are co-planar with the frontside and backside surfaces 112, 114 of the wafer, each of the TSVs 124, 126 may have a length in a range of about 10 microns to about 40 microns, and a width in a range of about 1 micron to about 5 microns, although the lengths and widths of the TSVs 124, 126 may be smaller or larger, as well. Further, the spacing between adjacent TSVs 124, 126 may be in a range of about 5 microns to about 10 microns, although the spacing may be smaller or larger, as well. According to an embodiment, a total length of each alignment pattern is in a range of about 100 microns to about 200 microns, and a total width of each alignment pattern is in a range of about 100 microns to about 200 microns, although the total length and/or total width may be smaller or larger, as well.

According to an embodiment, and as particularly shown in FIG. 2, the TSVs 124, 126 extend from the second substrate surface 214 at least to the first substrate surface 212 (e.g., the TSVs 124, 126 extend between the first and second substrate surfaces 212, 214). The TSVs 124, 126 may terminate at the first substrate surface 212, as shown in the illustrated embodiment of FIG. 2, or the TSVs 124, 126 may extend through some or all of the layers 280 overlying the first substrate surface 212 (e.g., up to and including extending to the wafer frontside 112), in other embodiments. Either way, each TSV 124, 126 has a first end 225 that is proximate to the second substrate surface 214, and a second end 227 that is distal from the first end 225, and that is either proximate to or above the first substrate surface 212.

One or more conductive layers 290 overlie the second substrate surface 214 and the first ends 225 of the TSVs 124, 126. According to an embodiment, the conductive layer(s) 290 are directly connected to the second substrate surface 214 and to the first ends 225 of the TSVs 124, 126 without any intervening material layers. In other embodiments, portions of one or more material layers (e.g., adhesion layers or dielectric layers) may be positioned between the conductive layers 290 and the second substrate surface 214 and/or the first ends 225 of the TSVs 124, 126.

According to an embodiment, the conductive layers 290 include a thin conductive layer 292 (referred to herein as a "seed layer") deposited over the second substrate surface 214 and the first ends 225 of the TSVs 124, 126, and a thick conductive layer 294 deposited over the seed layer 292. For example, the seed layer 292 may have a thickness 293 in a range of about 1000 angstroms to about 3000 angstroms, and the thick conductive layer 294 may have a thickness 295 in a range of about 10 microns to about 50 microns, although layers 292 and/or 294 may be thinner or thicker than these ranges, as well. For example, the seed layer 292 may be formed from a material selected from titanium copper alloy (TiCu), titanium tungsten copper alloy (TiWCu), titanium nickel copper alloy (TiNiCu), and the thick conductive layer 294 may be formed from a material selected from copper, gold, silver, titanium, nickel, nickel vanadium, or one or more other conductive metals or metal alloys, although layers 292, 294 may be formed from other conductive materials, as well.

According to an embodiment, and as indicated in the upper half of FIG. 2, the first ends 225 of the TSVs 124, 126 may be substantially co-planar with the second substrate surface 214. In an alternate embodiment, and as indicated in the lower left, enlarged view 250 of a portion of the wafer 110, the first ends 225 of the TSVs 124, 126 may be slightly recessed below the second substrate surface 214, which may result in corresponding contours in the surface 291 of the seed layer 292. In yet another alternate embodiment, and as indicated in the lower right, enlarged view 260 of a portion of the wafer 110, the first ends 225 of the TSVs 124, 126 may protrude slightly above the second substrate surface 214, which also may result in corresponding contours in the surface 291 of the seed layer 292.

As indicated above, the conductive layers 290 may be formed to provide one or more conductive features and one or more conductive material openings or voids on the backside of the wafer. As also indicated above, the conductive material voids intentionally may be aligned with circuit elements at the frontside of the wafer. For example, the circuit elements may include passive elements (e.g., inductors and/or capacitors), and the underlying conductive material voids may allow for an improvement in the quality factor (Q) for the circuit elements. According to an embodiment, one or more of semiconductor devices 150 may include a patterned portion of the conductive layers 290, which includes such conductive features and conductive material voids.

FIG. 3 is a cross-sectional, side view of semiconductor device 150 along line 3-3 of FIG. 1, according to an example embodiment. Semiconductor device 150 includes transistor 152, an input impedance matching circuit 154 (referred to simply as "input circuit" hereafter), an output impedance matching circuit 156 (referred to simply as "output circuit" hereafter), and a plurality of terminals 302, 304, 306. According to an embodiment, the terminals 302, 304, 306 each are formed from a portion of the patterned conductive layers 290 that are coupled to the bottom substrate surface 214, where voids in the patterned conductive layers 290 correspond to conductive material voids 380, 382. Some or all of the terminals 302, 304, 306 may be directly connected to the bottom substrate surface 214, or insulating material 356 may be present between some or all of the terminals 302, 304, 306 and the substrate 210 in order to electrically isolate the terminals 302, 304, 306 from the substrate 210, in various embodiments.

For example, transistor 152 may be a field effect transistor (FET) (such as a metal oxide semiconductor FET (MOSFET), a laterally diffused MOSFET (LDMOS FET), a high electron mobility transistor (HEMT), and so on), which includes a gate (control terminal), a source (a first current conducting terminal), and a drain (a second current conducting terminal). Alternatively, transistor 152 may be a bipolar junction transistor (BJT). Accordingly, references herein to a "gate," "drain," and "source," are not intended to be limiting, as each of these designations has analogous features for a BJT implementation (e.g., a base, collector, and emitter, respectively).

According to an embodiment, and using nomenclature typically applied to MOSFETs in a non-limiting manner, transistor 152 includes an active area 310, which may include a plurality of substantially parallel-aligned drain regions (not depicted) and source regions (not depicted) formed in the substrate 210 below the top substrate surface 212. A variably-conductive channel and, in some embodiments, a drain drift region are present between adjacent source and drain regions of each transistor finger. The source regions of transistor 152 may be coupled to voltage reference terminal 306 (e.g., a terminal coupled to ground or another voltage reference) through one or more conductive structures 364 (e.g., conductive vias, a heavily doped sinker region, and so on).

The gate of transistor 152, or more specifically gate contact 322, is coupled through the input circuit 154 to an input terminal 302. Similarly, the drain of transistor 152, or more specifically drain contact 324, is coupled through the output circuit 156 to an output terminal 304. Finally, the source of transistor 152 is coupled to a voltage reference terminal 306, which may in turn be coupled to ground (or another voltage reference). Through the variation of control signals (e.g., input RF signals) provided through input terminal 302 to the gate of transistor 152, the current between the source and drain of transistor 152 is modulated. For example, if the device 150 were to be incorporated into an amplifier system, input terminal 302 may be coupled to receive a relatively low-power, input RF signal for amplification. The input RF signal received through input terminal 302 is amplified through transistor 152, and the resultant amplified RF signal is output through output terminal 304.

According to an embodiment, the gate of transistor 152 and the input circuit 154 may be coupled to the input terminal 302 through one or more conductive structures 360 (e.g., conductive vias or other structures). According to an embodiment, the conductive structures 360 may include one or more TSVs 361, portions of conductive layers 381-383, and conductive vias 363 that electrically couple the portions of the conductive layers 381-383. TSVs 361 may be electrically isolated from substrate 210 with dielectric via lining material 362, in an embodiment, although lining material 362 may be excluded, in other embodiments.

The input RF signal is conveyed from the input terminal 302 through the input circuit 154 to the gate of transistor 152. Input circuit 154, which functions to filter the input RF signal, is coupled between the input terminal 302 and the control terminal of transistor 152. According to an embodiment, input circuit 154 is an input impedance matching circuit, which is configured to raise the impedance of device 150 to a higher (e.g., intermediate or higher) impedance level (e.g., in a range from about 2 to about 10 Ohms or higher). As mentioned above, input circuit 154 is coupled to the input terminal 302 through various conductive structures. Further, input circuit 154 may be coupled through one or more additional conductive structures 162 to voltage reference terminal 306 (or another distinct voltage reference terminal).

According to an embodiment, input circuit 154 includes an inductive element 316 and a shunt capacitor (not shown in FIG. 3). More specifically, a first plate (or terminal) of the shunt capacitor is electrically coupled to the input terminal 302 (e.g., through conductive structure(s)), and a second plate (or terminal) of the shunt capacitor is electrically coupled to the voltage reference terminal 306 (e.g., through conductive structure(s)). Inductive element 316 has a first terminal that also is electrically coupled to the input terminal 302 (e.g., through conductive structure(s)) and to the first plate of the shunt capacitor, and a second terminal that is electrically coupled to the control terminal of transistor 152. In this configuration, input circuit 154 operates as a low pass filter circuit. In alternate embodiments, input circuit 154 may be configured as a high pass filter circuit or as a bandpass filter circuit.

Finally, the drain of transistor 152 and the output circuit 156 may be coupled to output terminal 304 through one or more additional conductive structures 370 (e.g., conductive vias or other structures). According to an embodiment, the set of conductive structures 370 may include one or more TSVs 371, portions of conductive layers 381-383, and conductive vias 373 that electrically couple the portions of the conductive layers 381-383. TSVs 371 may be electrically isolated from substrate 210 with dielectric via lining material 372, in an embodiment, although lining material 372 may be excluded, in other embodiments.

Output circuit 156, which functions to filter the amplified RF signal, is coupled between the drain terminal 324 of transistor 152 and the output terminal 304. According to an embodiment, output circuit 156 is an output impedance matching circuit, which is configured to match the output impedance of device 150 with the input impedance of an external circuit or component (not shown) that may be coupled to output terminal 304 (e.g., 50 Ohms or some other value). As mentioned above, output circuit 156 is coupled to the drain of transistor 152 and to output terminal 304 through one or more conductive structures (e.g., conductive vias or other structures). In addition, output circuit 156 may be coupled through one or more additional conductive structures to voltage reference terminal 306 (or another distinct voltage reference terminal).

According to an embodiment, output circuit 156 includes a shunt inductive element 334 and a shunt capacitor (not shown in FIG. 3) coupled in series. More specifically, inductive element 334 has a first terminal that is electrically coupled to the drain of transistor 152, and also to output terminal 304 (e.g., through conductive structure(s)). Inductive element 334 has a second terminal that is coupled to a first plate (or terminal) of the shunt capacitor. A second plate (or terminal) of the shunt capacitor is electrically coupled to the voltage reference terminal 306 (or another distinct voltage reference terminal) through conductive structure(s). In this configuration, output circuit 156 operates as a high pass filter circuit. In alternate embodiments, output circuit 156 may be configured as a low pass filter circuit or as a bandpass filter circuit.

Each of the terminals 302, 304, 306 only partially covers the bottom substrate surface 214 to define a number of conductive material voids 380, 382. As used herein, a "conductive material void" is a portion of the bottom substrate surface 214 to which no conductive material (or at least no significant quantity of conductive material) is coupled. According to an embodiment, the terminals 302, 304, 306 are electrically isolated from each other across the bottom substrate surface 214 by the conductive material voids 380, 382.

According to an embodiment, conductive material voids 380, 382 are aligned with and located directly opposite (in a vertical direction, with respect to FIG. 3) portions 381, 383 of the top substrate surface 212 over which inductors 316, 334 are formed. Because the conductive layers 290 are lacking under inductors 316, 334 in the device 150, according to the various embodiments, inductors 316, 334 may be referred to herein as "floating" inductors. Inclusion of the conductive material voids 380, 382 under floating inductors 316, 334 enables the quality factor (Q) of inductors 316, 334 to be significantly increased, when compared with inductors implemented in devices that have a continuous ground plane across the entire bottom surface of the device. The higher Q of inductors 316, 334 may be achieved because the conductive material voids 380, 382 enable the voltage reference plane underlying inductors 316, 334 essentially to be "pushed away" (in distance) from inductors 316, 334. Although a voltage reference plane (e.g., a ground plane) may be located on a printed circuit board (PCB) or other substrate to which device 150 ultimately is coupled, and that voltage reference plane may underlie inductors 316, 334, the distance between the inductors 316, 334 and the voltage reference plane may be made to be significantly greater than the distance that otherwise would be defined if conductive layers 290 extended underneath inductors 316, 334.

Figure 4:
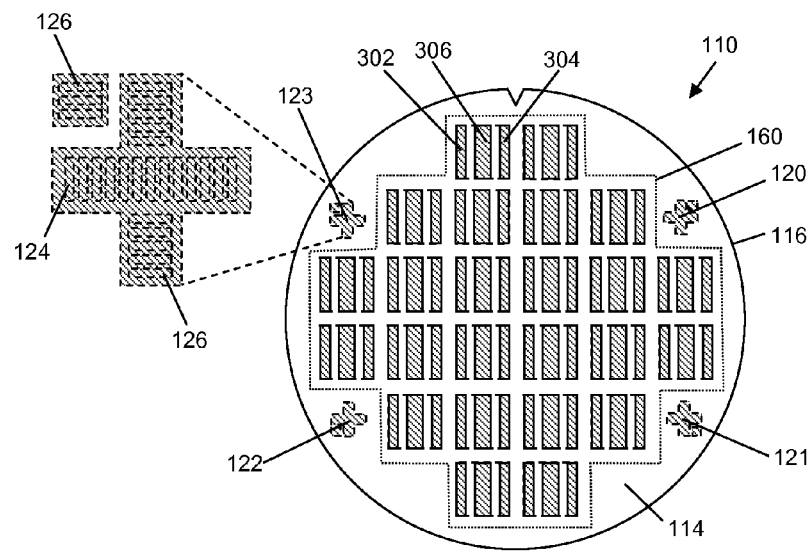
FIG. 4 is a bottom or backside view of the wafer of FIG. 1 depicting patterned backmetal over the plurality of semiconductor devices and alignment patterns, according to an example embodiment.

FIG. 4 is a bottom or backside view of the wafer 110 of FIG. 1 depicting patterned backmetal (i.e., patterned conductive layer 290) over the plurality of semiconductor devices 150 and alignment patterns 120-123, according to an example embodiment. As was discussed previously and illustrated in FIGS. 2 and 3, portions of the patterned conductive layer 290 overlie the alignment patterns 120-123 at the backside surface 114 of the wafer 110, and other portions of the patterned conductive layer 290 (e.g., corresponding to terminals 302, 304, 306) overlie the semiconductor devices 150 at the backside surface 114 of the wafer 110.

Figure 5:
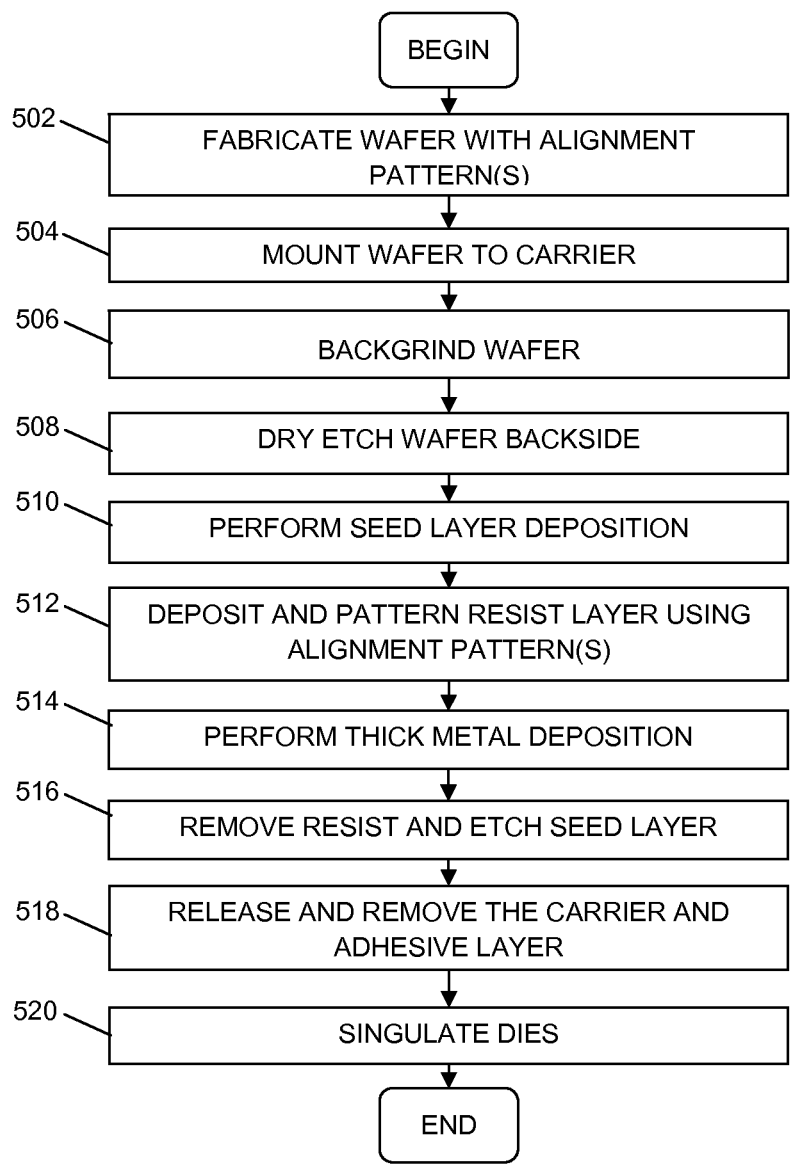
FIG. 5 is a flowchart of a portion of a method of manufacturing a semiconductor wafer with a plurality of semiconductor devices and alignment patterns, according to an example embodiment.

FIG. 5 is a flowchart of a portion of a method of manufacturing a semiconductor wafer (e.g., wafer 110, FIG. 1) with a plurality of semiconductor devices (e.g., devices 150) and TSV alignment patterns (e.g., alignment patterns 120-123), according to an example embodiment. FIG. 5 should be viewed in conjunction with FIGS. 6-13, which depict mostly side views of a semiconductor wafer 610 during various stages of the manufacturing method of FIG. 5. To avoid confusion, it should be noted that FIGS. 6-13 depict semiconductor wafer 610 with the wafer frontside 612 facing downward and the wafer backside 614 facing upward, in contrast with FIGS. 2 and 3, which depicted semiconductor wafer 110 in an opposite orientation.

As will be described in more detail below, the portion of the manufacturing process conveyed in FIGS. 5-13 essentially includes partially fabricating a semiconductor wafer 610 that has multiple TSV alignment patterns 620 and a plurality of semiconductor devices 650 proximate to the wafer frontside 612. The method further includes mounting the wafer frontside 612 of the partially-fabricated semiconductor wafer 610 to a wafer support carrier 670 with an adhesive layer 680 and a carrier release layer 690, performing a backside wafer thinning operation (e.g., backgrinding) to expose the ends of the TSVs at a newly revealed wafer backside 714, forming a patterned backmetal layer 1290 on the wafer backside 714, and demounting the wafer 610 from the wafer support carrier 670 after the wafer thinning and patterned backmetal deposition operations.

Figure 6:
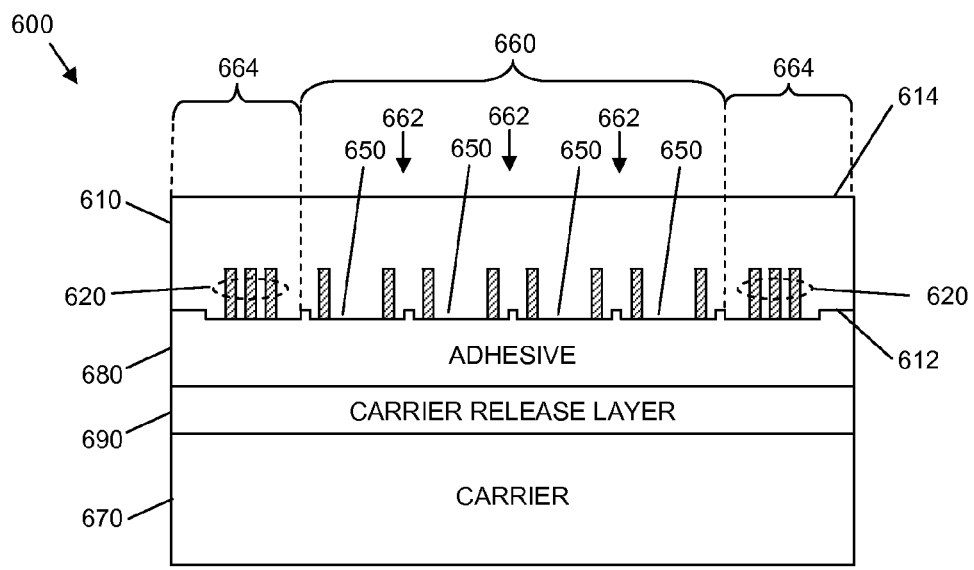
FIG. 6 is a side view of a wafer assembly, which includes an embodiment of a wafer coupled to a carrier prior to performing a wafer backgrinding operation.

The semiconductor manufacturing method may begin, in block 502, by partially fabricating a semiconductor wafer 610. The partial wafer fabrication process includes forming a plurality of semiconductor devices 650 (e.g., devices 150) in a device region 660 at a frontside 612 of the wafer 610, where sacrificial saw streets 662 separate adjacent devices 650. According to an embodiment, some or all of the plurality of semiconductor devices 650 include TSVs (e.g., TSVs 361, 364, 371). The partial wafer fabrication process also includes forming one or more alignment patterns 620 (e.g., alignment patterns 120-123) using TSVs (e.g., TSVs 124, 126) that extend from the frontside 612 of the wafer 610 at least partially through the thickness of the wafer 610 (e.g., to a depth that equals or exceeds a final wafer thickness). For example, the alignment patterns 620 may be formed in a sacrificial edge region 664 of the wafer 610, although alignment patterns also or alternatively may be formed in the device region 660. To reduce the likelihood of wafer breakage, it is commonplace to perform frontside wafer processing (e.g., formation of devices 650) with a wafer that is significantly thicker than a desired final wafer thickness, and (as will be described below), subsequently to flip the wafer over and backgrind the wafer backside to reduce the wafer thickness. Using such a process, the various TSVs (e.g., the TSVs of alignment patterns 620 and the TSVs of devices 650) may extend from the frontside 612 of the wafer only partially through the initial thickness of the wafer 610, as shown in FIG. 6. Alternatively, the TSVs may extend entirely through the wafer at this stage of processing.

In block 504, the partially fabricated semiconductor wafer 610 is mounted to a transparent wafer support carrier 670 (e.g., a glass carrier), in order to form a wafer assembly 600. To form the wafer assembly 600, an adhesive layer 680 is applied to the frontside 612 of the wafer 610, and a carrier release layer 690 is applied to a surface of a wafer support carrier 670. For example, the adhesive layer 680 may be applied to the semiconductor wafer 610 by spin-coating curable adhesive material on the frontside 612 of the wafer 610, although other adhesive application methods may be used, as well. For example, the adhesive layer 680 may be formed from a combination of one or more materials including an acrylic, a polymer, or other suitable materials. The carrier release layer 690 may be coated on the surface of the carrier 670. For example, the carrier release layer 690 may include a light to heat conversion (LTHC) material, such as a thermoplastic resin. Other materials also may be used.

The semiconductor wafer 610 (with the adhesive layer 680 attached) is then mounted to the carrier 670 (with the carrier release layer 690 attached) to form the semiconductor wafer assembly 600. For example, the adhesive and carrier release layers 680, 690 may be brought together mechanically in a chamber, the pressure in the chamber may be reduced using vacuum, the temperature in the chamber may be increased, and ultraviolet (UV) energy may be applied to the semiconductor wafer assembly 600 to cure the adhesive layer 680, thus mechanically coupling the adhesive and carrier release layers 680, 690. Alternative methods also may be used to mount the semiconductor wafer 610 to the carrier 670, in other embodiments.

Figure 7:
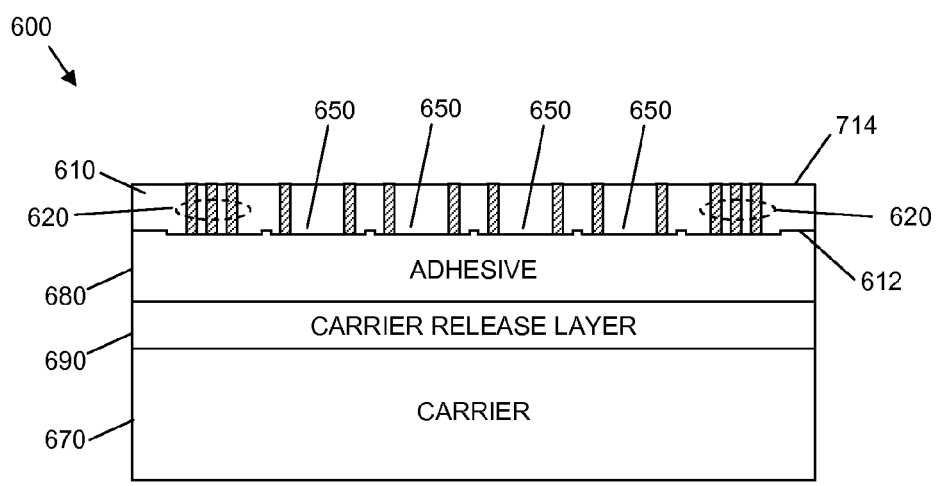
FIG. 7 is a side view of the wafer assembly of FIG. 6 after performing the wafer backgrinding operation.
Figure 8:
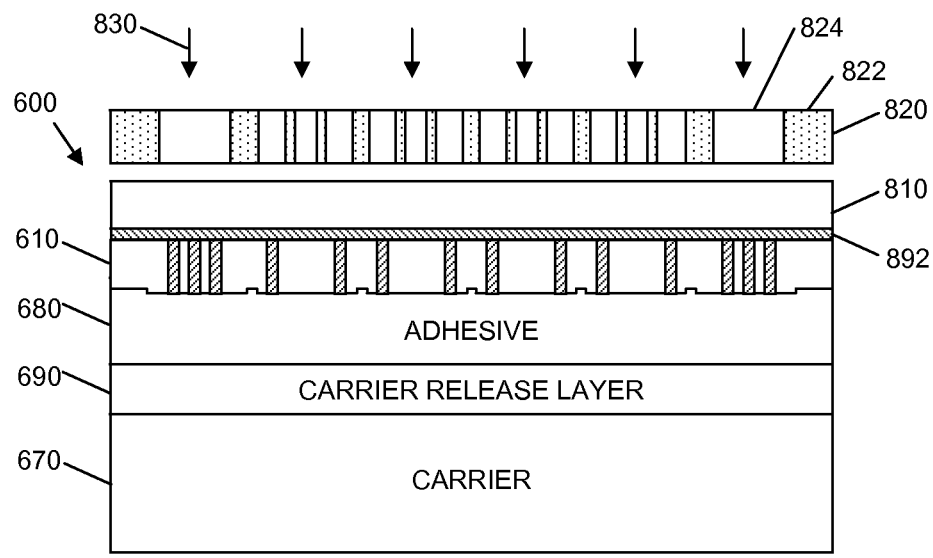
FIG. 8 is a side view of the wafer assembly of FIG. 7 at a first stage of a patterned backmetal deposition process, according to an embodiment.

Referring also to FIG. 7, which is a side view of the wafer assembly 600 at a subsequent stage of manufacturing, a backgrinding operation is performed on the wafer backside 614 in block 506 to thin the semiconductor wafer 610 to its final thickness and to expose a new backside 714 of the wafer 610. For example, the final wafer thickness may be in a range of about 50 microns to about 100 microns, although the final wafer thickness may be thicker or thinner, as well. In addition, the thinning operation may expose ends (e.g., first ends 225) of the TSVs associated with the alignment patterns 620 and the devices 650.

Microscopic scratches, referred to herein as "grind marks," may be imparted on the wafer backside 714 during the backgrinding operation. Within a local area of the wafer backside 714, the grind marks tend to be oriented in parallel direction. In the area of an alignment pattern (e.g., alignment pattern 120), when an angle between the grind mark direction and the primary axis (e.g., primary axis 125) of a TSV (e.g., one of TSVs 124) is relatively small, the grind marks may obscure the TSV, making the TSV difficult to detect using standard alignment equipment. However, because embodiments of alignment patterns include TSVs (e.g., TSVs 124, 126) with primary axes (e.g., primary axes 125, 127) that extend in different directions (e.g., 90 degrees offset from each other), grind marks that are substantially parallel with the primary axis of one set of TSVs (e.g., TSVs 124) necessarily would not be substantially parallel with the primary axis of the other set of TSVs (e.g., TSVs 126). Accordingly, even though grind marks in the area of a particular alignment pattern may obscure one set of TSVs (e.g., TSVs 124), the grind marks may not significantly obscure the other set of TSVs (e.g., TSVs 126) to the point that the other set of TSVs becomes undetectable using standard alignment equipment.

Conventional wafer processing often includes performing a wet etching process on the wafer backside after the backgrinding operation in order to alleviate stresses in the semiconductor wafer due to the grind marks. More particularly, the wet etching process is intended to return the wafer backside substantially to monocrystalline semiconductor material. However, such a wet etching process may compromise the TSVs of the alignment patterns 620 and the devices 650 (e.g., the process may remove the material within the TSVs), and therefore such a process may be undesirable during processing of semiconductor wafer 610. According to an embodiment, rather than performing a wet etching process, a dry etching process optionally may be performed, in block 508, to alleviate some of the wafer surface damage imparted by the backgrinding operation. In an alternate embodiment, the dry etching process may be excluded from the process.

Blocks 510-514 comprise a set of steps for depositing a thick, patterned backside conductive layer (e.g., conductive layer 290), according to an embodiment. As discussed previously, the conductive layer may include a relatively thin seed layer (e.g., layer 292) and a thick conductive layer (e.g., layer 294) over the seed layer. Referring first to block 510 and FIG. 8, deposition of the patterned backside conductive layer may include depositing a conductive seed layer 892 (e.g., layer 292) on the backside 714 of the wafer 610. For example, the seed layer 892 may be deposited using a physical vapor deposition (PVD) process (e.g., sputtering), although the seed layer 892 may be deposited using some other deposition technique, as well. In some cases, the seed layer 892 may enhance visibility of the TSVs of the alignment patterns 620 by accentuating the edges of the TSVs.

In block 512, a resist layer 810 is deposited on the seed layer 892, and the resist layer 810 is patterned. The below description corresponds to a patterning process in which a positive resist is used. In an alternate embodiment, a negative resist may be used, and one of skill in the art would understand, based on the description herein, how to modify the process to achieve the same result.

Figure 9:
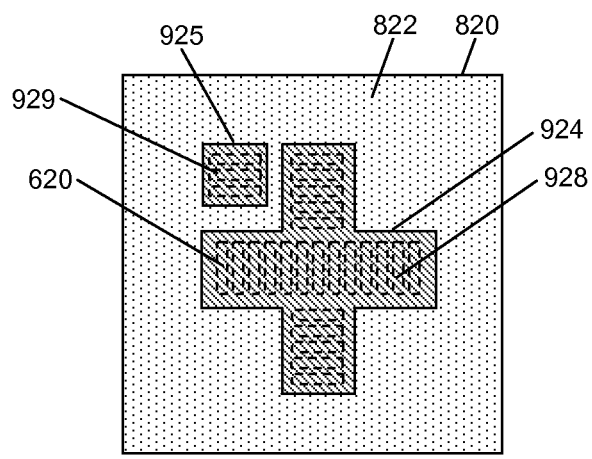
FIG. 9 is a bottom or backside view of a mask opening aligned with an alignment pattern, according to an example embodiment.

According to an embodiment, to pattern the resist layer 810, a mask 820 (e.g., a chrome mask) is aligned with the wafer 610 over the resist layer 810 using one or more of the alignment patterns 620. More specifically, the mask 820 includes opaque regions 822 (e.g., chrome-film covered regions) and transparent regions 824, where the shapes of the transparent regions 824 correspond to the shapes of conductive features that are to be formed on the wafer 610. At least one of the transparent regions 824 is an alignment "key," which is a transparent region 824 having a shape that corresponds to the shape of an alignment pattern 620. For example, FIG. 9 is a top view of a portion of a mask 820 that includes an alignment key through which an alignment pattern 620 is visible. More specifically, the mask 820 includes an opaque region 822 and two transparent regions 924, 925 through which the main area 928 and a pattern identifier area 929 of the alignment pattern 620, respectively, are visible. To align the mask 820 with the alignment pattern 620, the mask 820 is roughly aligned with the wafer 610, the mask 820 is rotated until the alignment pattern 620 is visible through the alignment key (e.g., transparent regions 924, 925), and then minor x-axis and y-axis adjustments are made until the alignment pattern 620 and the alignment key are aligned with acceptable accuracy.

Figure 10:
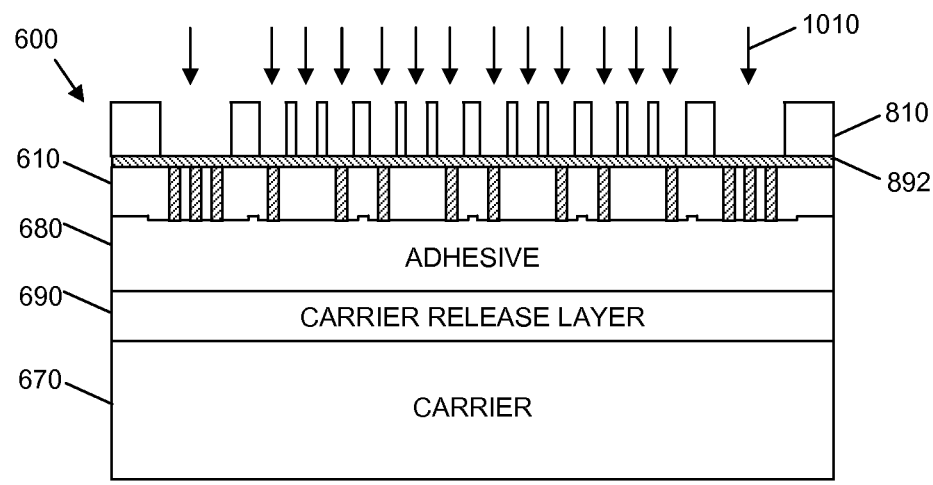
FIG. 10 is a side view of the wafer assembly of FIG. 8 at a second stage of the patterned backmetal deposition process, according to an embodiment.

Referring again to FIG. 8, portions of the resist layer 810 that are visible through the transparent regions 824, 924, 925 of the mask 820 are then exposed to ultraviolet (UV) light, as indicated by arrows 830. This process renders the exposed portions of the resist layer 810 more soluble. Referring now to FIG. 10, the mask 820 is removed, and the exposed portions of the resist layer 810 are washed away by developer solution. This yields a patterned resist layer 810 with openings 1010 through which portions of the seed layer 892 are exposed.

Figure 11:
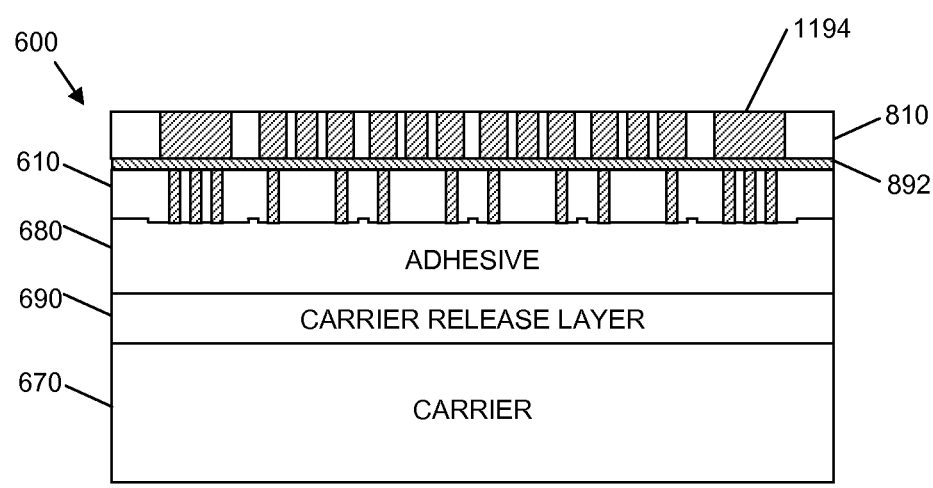
FIG. 11 is a side view of the wafer assembly of FIG. 10 at a third stage of the patterned backmetal deposition process, according to an embodiment.

Referring now to FIG. 11, a thick metal layer 1194 (e.g., layer 294) is deposited through the openings 1010 in the resist layer 810 onto the exposed portions of the seed layer 892, in block 514. According to an embodiment, deposition of the thick metal layer 1194 is performed using an electroplating process, in which the seed layer 892 functions as an anode to which the material of the thick metal layer 1194 is attracted (and adheres). In an alternate embodiment in which the wafer 610 is sufficiently conductive, the seed layer 892 may be excluded, and the wafer itself may be used as the anode for the electroplating process. The electroplating process may be repeated multiple times to form successive layers of material that makes up the thick metal layer 1194. Once the desired thickness of the thick metal layer 1194 is achieved, the electroplating process may terminate.

Figure 12:
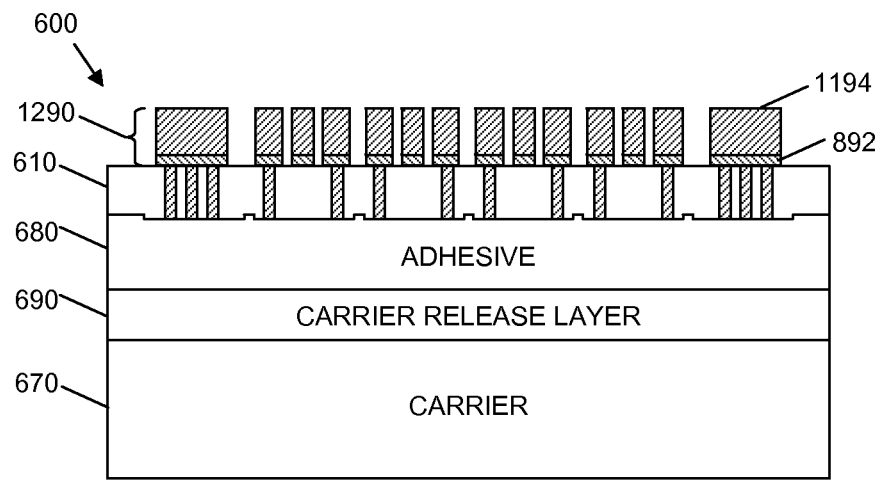
FIG. 12 is a side view of the wafer assembly of FIG. 11 at a fourth stage of the patterned backmetal deposition process, according to an embodiment.

Referring now to FIG. 12, the remaining portions of resist layer 810 may be removed, and the exposed portions of the seed layer 892 may be etched away, in block 516. In this process, the thick metal layer 1194 may function as a mask to the seed metal etchant. The etching process completes the process of forming the patterned backmetal layer 1290.

Figure 13:
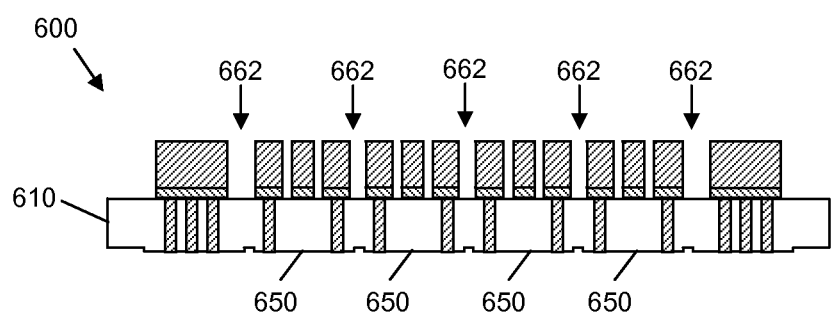
FIG. 13 is a side view of the wafer of FIG. 12 a after performing a carrier demount operation.

In block 518, a demount operation is performed to release the wafer support carrier 670 from the semiconductor wafer 610. During the demount operation, the semiconductor wafer assembly 600 is placed within a chamber of a laser system with the wafer 610 (or surface 714) facing and supported by a wafer assembly support table, and with the wafer support carrier 670 facing toward a laser of the laser system. The laser system emits and directs a laser beam toward the semiconductor wafer assembly 600. More particularly, the laser beam is directed through the transparent wafer support carrier 670 toward the carrier release layer 690. The laser beam is characterized by laser parameters that are selected so that the laser beam will compromise the physical integrity of (e.g., ablate) the carrier release layer 690. Once the physical integrity of the carrier release layer 690 has been sufficiently compromised (i.e., the carrier 670 has been released), the carrier 670 may then be removed from the semiconductor wafer 610. The adhesive layer 680 may then be removed (e.g., peeled) from the wafer frontside 612. FIG. 13 is a side view of the wafer 610 of FIG. 12 after performing the carrier demount and adhesive removal operations.

In block 520, a singulation process may then be performed to separate the individual devices 650 from the wafer 610. In particular, singulation includes removing wafer material in the sacrificial saw streets 662, such as by sawing, laser cutting, or other wafer material removal methods.

An embodiment of a semiconductor wafer includes a semiconductor substrate, a plurality of TSVs, and a conductive layer. The semiconductor substrate has a first substrate surface and a second substrate surface. The plurality of TSVs extends between the first and second substrate surfaces. The plurality of TSVs includes a first subset of one or more trench vias each having a primary axis aligned in a first direction, and a second subset of one or more trench vias each having a primary axis aligned in a second direction that is different from the first direction. The plurality of TSVs forms an alignment pattern in an alignment area of the substrate. The conductive layer is directly connected to the second substrate surface and to first ends of the plurality of TSVs.

Another embodiment of a semiconductor wafer includes a semiconductor wafer, a plurality of first TSVs, a semiconductor device, a second TSV, and a patterned conductive layer. The semiconductor substrate has a first substrate surface and a second substrate surface. The plurality of first TSVs extend between the first and second substrate surfaces. The plurality of first TSVs includes a first subset of one or more trench vias each having a primary axis aligned in a first direction, and a second subset of one or more trench vias each having a primary axis aligned in a second direction that is different from the first direction. The plurality of first TSVs forms an alignment pattern in an alignment area of the substrate. The semiconductor device is formed at the first substrate surface, and the semiconductor device includes a plurality of terminals. The second TSV extends between the first and second substrate surfaces, and the second TAV is electrically coupled to at least one of the plurality of terminals of the semiconductor device. The patterned conductive layer is directly connected to the second substrate surface, to first ends of the plurality of first TSVs, and to a first end of the second TSV.

An embodiment of a method of fabricating a semiconductor wafer includes forming a plurality of TSVs through a semiconductor substrate that has a first substrate surface and a second substrate surface. The plurality of TSVs includes a first subset of one or more trench vias each having a primary axis aligned in a first direction, and a second subset of one or more trench vias each having a primary axis aligned in a second direction that is different from the first direction, and the plurality of TSVs form an alignment pattern in an alignment area of the substrate. The method further includes forming a conductive layer directly on the second substrate surface and directly connected to first ends of the plurality of TSVs.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor wafer comprising:
   a semiconductor substrate having a first substrate surface and a second substrate surface;
   a plurality of build up layers on the first substrate surface, wherein the plurality of build up layers include conductive layers and conductive vias that are electrically coupled to device terminals that are located over the first substrate surface in a device area of the substrate;

a plurality of first through substrate vias extending between the first and second substrate surfaces, wherein the plurality of first through substrate vias includes a first subset of one or more trench vias each having a primary axis aligned in a first direction, and a second subset of one or more trench vias each having a primary axis aligned in a second direction that is different from the first direction, and the plurality of first through substrate vias form an alignment pattern in an alignment area of the substrate;

a second through substrate via extending between the first and second substrate surfaces in the device area of the substrate; and a conductive layer directly connected to the second substrate surface and to first ends of the plurality of first through substrate vias, wherein the conductive layer is patterned so that a first portion of the conductive layer is directly coupled to the plurality of first through substrate vias, and a second portion of the conductive layer is directly coupled to the second through substrate via, and wherein a conductive material void is present, at the second substrate surface, in the conductive layer.

2. The semiconductor wafer of claim 1, wherein the conductive layer comprises:
a seed metal layer directly coupled to the second substrate surface; and
a thick metal layer coupled to the seed layer.

3. The semiconductor wafer of claim 2, wherein the thick metal layer has a thickness in a range of 10 microns to 50 microns.

4. The semiconductor wafer of claim 1, further comprising:
a transistor formed at the first substrate surface, wherein the second through substrate via is electrically coupled to the transistor.

5. The semiconductor wafer of claim 1, wherein the first ends of the plurality of first through substrate vias have relative positions with respect to the second substrate surface that are selected from a position that is slightly recessed from the second substrate surface, a position that is slightly above the second substrate surface, and a position that is substantially co-planar with the second substrate surface.

6. The semiconductor wafer of claim 1, wherein the first direction is orthogonal to the second direction.

7. The semiconductor wafer of claim 1, wherein the semiconductor substrate is a high resistivity substrate having a resistance in a range from 1000 ohm/centimeter to 100,000 ohm/centimeter.

8. A semiconductor wafer comprising:
a semiconductor substrate having a first substrate surface and a second substrate surface;
a plurality of first through substrate vias extending between the first and second substrate surfaces, wherein the plurality of first through substrate vias includes a first subset of one or more trench vias each having a primary axis aligned in a first direction, and a second subset of one or more trench vias each having a primary axis aligned in a second direction that is different from the first direction, and the plurality of first through substrate vias form an alignment pattern in an alignment area of the substrate;
a second through substrate via extending between the first and second substrate surfaces in a device area of the substrate;
a conductive layer directly connected to the second substrate surface and to first ends of the plurality of first through substrate vias, wherein the conductive layer is patterned so that a first portion of the conductive layer is directly coupled to the plurality of first through substrate vias, and a second portion of the conductive layer is directly coupled to the second through substrate via, and wherein a conductive material void is present, at the second substrate surface, in the conductive layer;
a transistor formed at the first substrate surface, wherein the second through substrate via is electrically coupled to the transistor; and
an inductor formed at the first substrate surface, and electrically coupled to the transistor, wherein the inductor is aligned with the conductive material void.

9. A semiconductor wafer comprising:
a semiconductor substrate having a first substrate surface and a second substrate surface;
a plurality of build up layers on the first substrate surface, wherein the plurality of build up layers include conductive layers and conductive vias;
a plurality of first through substrate vias extending between the first and second substrate surfaces, wherein the plurality of first through substrate vias includes a first subset of one or more trench vias each having a primary axis aligned in a first direction, and a second subset of one or more trench vias each having a primary axis aligned in a second direction that is different from the first direction, and the plurality of first through substrate vias form an alignment pattern in an alignment area of the substrate;
a semiconductor device formed at the first substrate surface, wherein the semiconductor device includes a plurality of terminals that are electrically coupled to the conductive layers and the conductive vias of the plurality of build up layers;
a second through substrate via extending between the first and second substrate surfaces, wherein the second through substrate via is electrically coupled to at least one of the plurality of terminals of the semiconductor device; and
a patterned conductive layer directly connected to the second substrate surface, wherein the patterned conductive layer includes a first portion directly coupled to first ends of the plurality of first through substrate vias, and a second portion directly coupled to a first end of the second through substrate via, and wherein a conductive material void is present, at the second substrate surface, in the patterned conductive layer.

10. The semiconductor wafer of claim 9, wherein the first direction is orthogonal to the second direction.

11. A semiconductor wafer comprising:
a semiconductor substrate having a first substrate surface and a second substrate surface;
a plurality of first through substrate vias extending between the first and second substrate surfaces, wherein the plurality of first through substrate vias includes a first subset of one or more trench vias each having a primary axis aligned in a first direction, and a second subset of one or more trench vias each having a primary axis aligned in a second direction that is different from the first direction, and the plurality of first through substrate vias form an alignment pattern in an alignment area of the substrate;
a semiconductor device formed at the first substrate surface, wherein the semiconductor device includes a plurality of terminals;
an inductor formed at the first substrate surface, and electrically coupled to at least one of the plurality of terminals of the semiconductor device;

a second through substrate via extending between the first and second substrate surfaces, wherein the second through substrate via is electrically coupled to at least one of the plurality of terminals of the semiconductor device; and a patterned conductive layer directly connected to the second substrate surface, to first ends of the plurality of first through substrate vias, and to a first end of the second through substrate via, and wherein the patterned conductive layer includes a conductive material void that is aligned with the inductor.

12. A method of fabricating a semiconductor wafer comprising:

forming a plurality of first through substrate vias through a semiconductor substrate that has a first substrate surface and a second substrate surface, wherein the plurality of first through substrate vias includes a first subset of one or more trench vias each having a primary axis aligned in a first direction, and a second subset of one or more trench vias each having a primary axis aligned in a second direction that is different from the first direction, and the plurality of first through substrate vias form an alignment pattern in an alignment area of the substrate;

forming a second through substrate via extending between the first and second substrate surfaces in a device area of the substrate;

forming a plurality of build up layers on the first substrate surface, wherein the plurality of build up layers include conductive layers and conductive vias that are electrically coupled to device terminals that are located over the first substrate surface in the device area of the substrate; and forming a conductive layer directly on the second substrate surface and directly connected to first ends of the plurality of first through substrate vias; and patterning the conductive layer so that a first portion of the conductive layer is directly coupled to the plurality of first through substrate vias, and a second portion of the conductive layer is directly coupled to the second through substrate via, and wherein a conductive material void is present, at the second substrate surface, in the conductive layer.

13. The method of claim 12, wherein forming the conductive layer comprises:

forming a seed metal layer directly on the second substrate surface; and forming a thick metal layer on the seed layer.

14. The method of claim 12, further comprising:

forming a transistor at the first substrate surface, wherein the transistor includes a control terminal, a first current carrying terminal, and a second current carrying terminal, and wherein the second through substrate via is electrically coupled to the first current carrying terminal of the transistor.

15. The method of claim 12, further comprising:

forming a transistor at the first substrate surface;

forming an inductor at the first substrate surface; and electrically coupling the inductor to a terminal of the transistor, wherein the inductor is aligned with the conductive material void.

16. The method of claim 12, wherein the first ends of the plurality of first through substrate vias have relative positions with respect to the second substrate surface that are selected from a position that is slightly recessed from the second substrate surface, a position that is slightly above the second substrate surface, and a position that is substantially co-planar with the second substrate surface.

17. The method of claim 12, wherein the first direction is orthogonal to the second direction.

\* \* \* \* \*